(12) United States Patent
Konishi et al.

(10) Patent No.: US 7,862,694 B2
(45) Date of Patent: Jan. 4, 2011

(54) COMPOSITE COATING DEVICE AND METHOD OF FORMING OVERCOAT ON MAGNETIC HEAD USING THE SAME

(75) Inventors: Yoshiyuki Konishi, Hadano (JP); Masahiro Ueda, Atsugi (JP); Masayasu Suzuki, Hadano (JP)

(73) Assignee: Shimadzu Corporation, Kyoto (JP)

( * ) Notice: Subject to any disclaimer, the term of this patent is extended or adjusted under 35 U.S.C. 154(b) by 2194 days.

(21) Appl. No.: 10/854,238

(22) Filed: May 27, 2004

(65) Prior Publication Data
US 2004/0264044 A1   Dec. 30, 2004

(30) Foreign Application Priority Data
Jun. 24, 2003   (JP) .............................. 2003-179544

(51) Int. Cl.
C25B 9/00 (2006.01)
C25B 11/00 (2006.01)
C25B 13/00 (2006.01)
C23C 14/00 (2006.01)
C23C 16/00 (2006.01)

(52) U.S. Cl. ........................... 204/298.34; 204/298.35; 204/298.36; 204/298.39; 204/298.41; 204/298.01; 204/298.12; 118/723 MA

(58) Field of Classification Search .............. 118/500, 118/719, 723 MA; 156/345.46; 198/378; 204/192.32, 298.04, 298.25, 298.26, 298, 204/298.12, 298.28, 298.35, 298.36, 298.39, 204/298.41; 219/121.43; 264/1.33; 427/128, 427/131, 404, 524, 577, 585; 428/332, 639; 430/5
See application file for complete search history.

(56) References Cited

U.S. PATENT DOCUMENTS

| | | | | | |
|---|---|---|---|---|---|
| 4,080,281 | A | * | 3/1978 | Endo | 204/298.28 |
| 4,278,493 | A | * | 7/1981 | Petvai | 204/192.32 |
| 4,447,773 | A | * | 5/1984 | Aston | 313/360.1 |
| 4,674,621 | A | * | 6/1987 | Takahashi | 198/378 |
| 4,951,601 | A | * | 8/1990 | Maydan et al. | 118/719 |
| 5,405,646 | A | * | 4/1995 | Nanis | 427/131 |
| 5,514,260 | A | * | 5/1996 | Seo | 204/298.26 |
| 5,674,573 | A | * | 10/1997 | Mitani et al. | 427/577 |
| 5,783,055 | A | * | 7/1998 | Kamei et al. | 204/298.04 |
| 5,820,980 | A | * | 10/1998 | Asakawa et al. | 428/332 |
| 5,830,272 | A | * | 11/1998 | Begin et al. | 118/500 |

(Continued)

FOREIGN PATENT DOCUMENTS

WO    WO 9010945    *   9/1990

*Primary Examiner*—Alexa D Neckel
*Assistant Examiner*—Michael Band
(74) *Attorney, Agent, or Firm*—Manabu Kanesaka

(57) ABSTRACT

A composite coating device includes first to third processing chambers. The first processing chamber performs an ion beam etching as a pretreatment process in which an ion beam is irradiated on a surface of a magnetic head at a predetermined angle and the surface is removed for a predetermined depth. The second processing chamber performs a magnetron sputter deposition as a shock absorbing coating formation process in which a shock absorbing coating is formed on the pretreated surface. The third processing chamber performs an electron cyclotron resonance plasma chemical vapor epitaxy or a cathode arc discharge deposition as an overcoat formation process in which an overcoat is formed on the shock absorbing coating. A preparation chamber communicates with the first to third processing chambers through opening and closing devices for transferring the magnetic head.

10 Claims, 13 Drawing Sheets

U.S. PATENT DOCUMENTS

| | | | |
|---|---|---|---|
| 5,858,471 A * | 1/1999 | Ray et al. ................... 427/524 |
| 6,015,476 A * | 1/2000 | Schlueter et al. ....... 156/345.46 |
| 6,086,796 A * | 7/2000 | Brown et al. ............... 264/1.33 |
| 6,228,439 B1 * | 5/2001 | Watanabe et al. ........... 427/585 |
| 6,235,171 B1 * | 5/2001 | Yamamoto ............. 204/298.25 |
| 6,268,582 B1 * | 7/2001 | Akita et al. ............ 219/121.43 |
| 6,346,768 B1 * | 2/2002 | Proudfoot ................ 313/359.1 |
| 6,541,164 B1 * | 4/2003 | Kumar et al. ................... 430/5 |
| 6,718,623 B2 * | 4/2004 | Sasaki et al. ............. 29/603.14 |
| 2002/0015855 A1 * | 2/2002 | Sajoto et al. ................ 428/639 |
| 2002/0064594 A1 * | 5/2002 | Nakajima et al. .......... 427/128 |
| 2003/0044539 A1 * | 3/2003 | Oswald ...................... 427/404 |

* cited by examiner

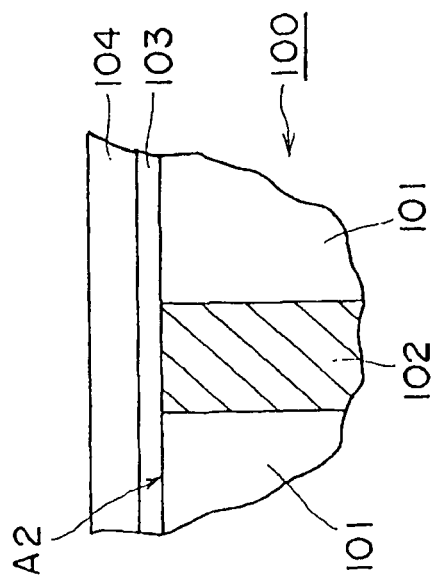
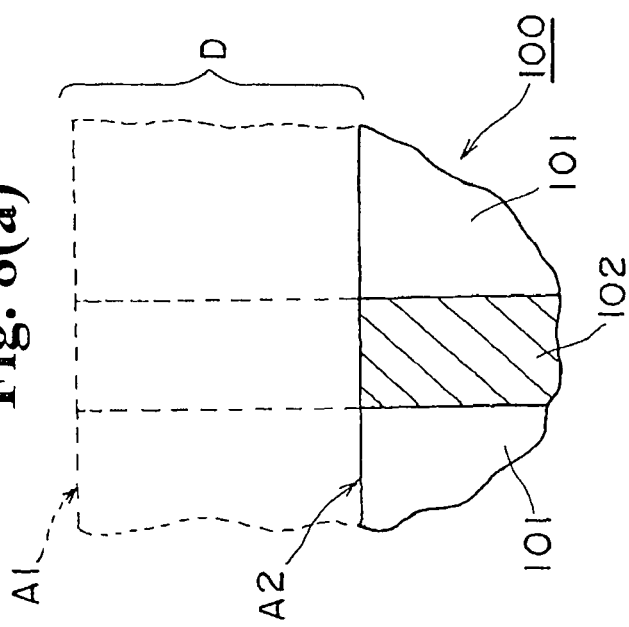
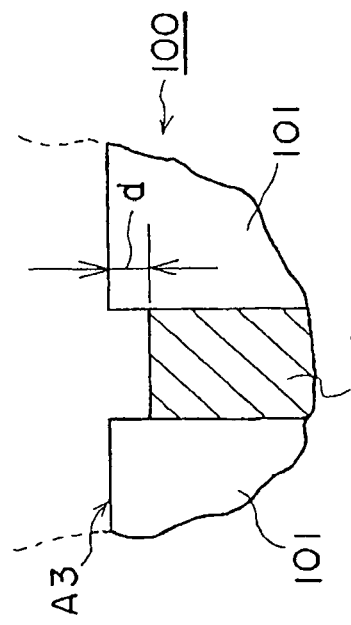

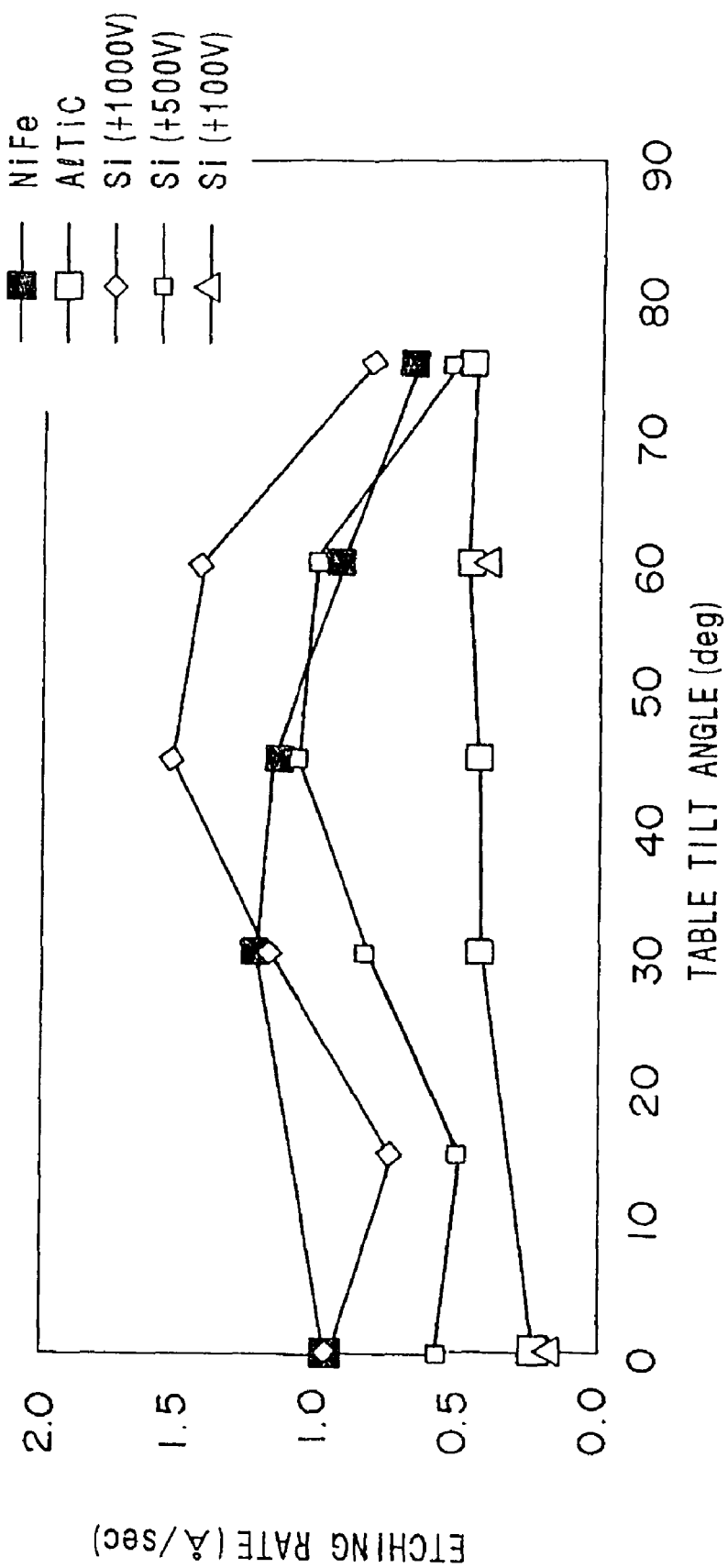

COMPOSITE COATING DEVICE AND METHOD OF FORMING OVERCOAT ON MAGNETIC HEAD USING THE SAME

BACKGROUND OF THE INVENTION AND RELATED ART STATEMENT

The present invention relates to a composite coating device for forming a composite coating on a magnetic head and a method of forming a composite coating on a magnetic head.

In a magnetic storage device, a magnetic head is used to record and retrieve data stored in a magnetic storage media. For example, in a hard drive (HD) magnetic storage device in which data is recorded on a magnetic disk, when a magnetic head records and retrieves (access) data, the magnetic head rises from a disk surface only for a predetermined distance. When the magnetic head does not access data, the magnetic head lands on the disk surface in a so-called CSS (contact start and stop) mechanism.

As described above, when the magnetic head does not access data, the magnetic head receives a shock from the disk. The magnetic head also receives a corrosive action through atmospheric moisture and the like, so that wear resistance and corrosion resistance are required for an overcoat of the magnetic head. In addition, as the recording density has been increasing, it is required to reduce a thickness of the overcoat to reduce a distance between an electrode of the magnetic head and a recording layer on the magnetic disk (flight height).

In general, an overcoat of the magnetic head is formed through a manufacturing process comprising (1) a pretreatment process in which a coating surface of a head body is cleaned; (2) a shock absorbing coating formation process in which an amorphous silicon coating is formed; and (3) an overcoat formation process in which a DLC coating is formed. A composite coating device is used to carry out the processes in three independent processing chambers, respectively. The composite coating device performs a sputter etching for the pretreatment process, sputter deposition for the shock absorbing coating formation process, and electron cyclotron resonance plasma chemical vapor epitaxy or cathode arc discharge deposition for the overcoat formation process (refer to Japanese Patent Publication (Kokai) No. 2001-195717).

When the sputter etching is used for the pretreatment process, there is the following problem. An overcoat is formed on a surface of a magnetic head. The surface includes a portion formed of a soft electrode metal, for example, Permalloy, and a portion formed of a hard base metal, for example, AlTic ($Al_2O_3 TiC$). Accordingly, the portions of the surface are etched at different etch rates, i.e. the portion formed of Permalloy is etched at a higher speed, thereby forming a recessed portion on the surface. As a result, the flight height increases, thereby making it difficult to obtain high recording density.

In view of the problem described above, an object of the present invention is to provide a composite coating device and an overcoat formation method, in which an overcoat is formed on a magnetic head while a flight height in the magnetic recording is reduced.

Further objects and advantages of the invention will be apparent from the following description of the invention.

SUMMARY OF THE INVENTION

In order to attain the objects described above, according to a first aspect of the present invention, a composite coating device includes a first processing chamber for performing ion beam etching as a pretreatment process in which an ion beam is irradiated on a surface of a magnetic head at a predetermined angle and the surface is removed for a predetermined depth; a second processing chamber for performing magnetron sputter deposition as a shock absorbing coating formation process in which a shock absorbing coating is formed on the pretreated surface; a third processing chamber for performing electron cyclotron resonance plasma chemical vapor epitaxy as an overcoat formation process in which an overcoat is formed on the surface with the shock absorbing coating formed thereon; and a preparation chamber communicating with the first to third processing chambers through opening and closing means for transferring the magnetic head.

According to a second aspect of the present invention, a composite coating device includes a first processing chamber for performing ion beam etching as a pretreatment process in which an ion beam is irradiated on a surface of a magnetic head at a predetermined angle and the surface is removed for a predetermined depth; a second processing chamber for performing magnetron sputter deposition as a shock absorbing coating formation process in which a shock absorbing coating is formed on the pretreated surface; a third processing chamber for performing cathode arc discharge deposition as an overcoat formation process in which an overcoat is formed on the surface with the shock absorbing coating formed thereon; and a preparation chamber communicating with the first to third processing chambers through opening and closing means for transferring the magnetic head.

According to a third aspect of the present invention, in the composite coating devices in the first and second aspects, an ion beam etching device includes an ion source provided with an electrode for obtaining ions having a first grid with positive potential and a second grid with negative potential; and a communicating portion for eliminating an effect of the potential of the second grid relative to an electron in a plasma production area and for communicating a plasma production area with an outside of the plasma production area. The ion beam etching device may be provided with a dielectric block for adjusting a plasma density distribution at a plasma production portion. The ion beam etching device may also be provided with a high-frequency induction coupled plasma source including an electric insulation dividing wall projecting into the plasma production area and separating the plasma production chamber from outside, and an excitation coil provided in an outer concave portion of the electric insulation dividing wall.

In the composite coating device, the shock absorbing coat is formed of a silicon layer, and the overcoat is formed of a carbon layer. Especially, the silicon layer may be formed of an amorphous silicon, and the carbon layer is formed of one of a diamond-like carbon (DLC) layer or a tetrahedral amorphous carbon (ta-C) layer.

According to the present invention, a method of forming the overcoat on the magnetic head includes steps of the ion beam etching, the magnetron sputter deposition, and the electron cyclotron resonance plasma chemical vapor epitaxy in this order using the composite coating device described above.

According to the present invention, a method of forming the overcoat on the magnetic head may include steps of the ion beam etching, the magnetron sputter deposition, and the cathode arc discharge deposition in this order using the composite coating device described above.

According to the present invention, the magnetic head is formed with one of the overcoat formation methods described above.

BRIEF DESCRIPTION OF THE DRAWINGS

FIGS. 8(a) to 8(c) are sectional views of a magnetic head, wherein FIG. 8(a) is a sectional view showing a state that a substrate is etched with an IBE device, FIG. 8(b) is a sectional view showing a state wherein an amorphous silicon coat and a DLC coat are formed on the substrate after the etching, and FIG. 8(c) is a sectional view showing an actual state of the substrate;

FIG. 9 is a graph showing etching performance of the ion beam etching device according to the embodiment of the present invention;

DETAILED DESCRIPTION OF PREFERRED EMBODIMENTS

Figure 1:
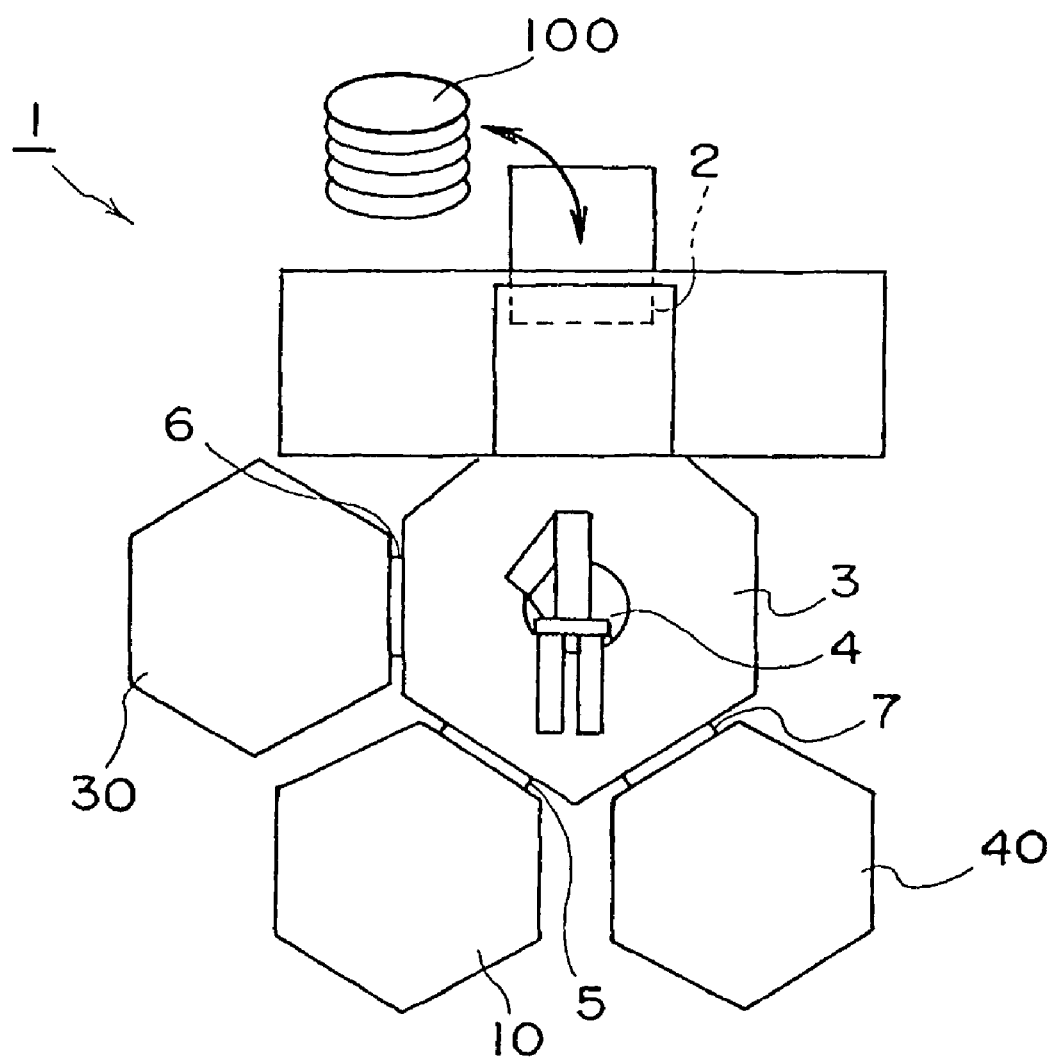
FIG. 1 is a schematic view showing a structure of a composite coating device according to an embodiment of the present invention.

Hereunder, embodiments of the present invention will be described with reference to the accompanying drawings. FIG. 1 is a schematic view showing a structure of a composite coating device according to an embodiment of the present invention.

As shown in FIG. 1, a composite coating device 1 includes a cassette chamber 2 wherein a substrate 100 with a plurality of magnetic heads arranged thereon is taken in and out; a conveyance chamber 3 wherein the substrate 100 is transferred; an IBE device 10 for performing ion beam etching (hereinafter, referred to as IBE); a MSD device 30 for performing magnetron sputter deposition (hereinafter, referred to as MSD); and an ECR-CVD device 40 for performing electron cyclotron resonance plasma chemical vapor epitaxy (hereinafter, referred to as ECR-CVD). The conveyance chamber 3 is connected with the IBE device 10, the MSD device 30, and the ECR-CVD device 40 through gates 5, 6 and 7, respectively. The substrate 100 inside the conveyance chamber 3 is conveyed to each device by a conveyance mechanism 4, and the substrate 100 inside each device is carried in the conveyance chamber 3 by the conveyance mechanism 4.

In the embodiment, the composite coating device 1 is used for forming an overcoat on the magnetic head. Before the overcoat formation, an electrode metal, a base metal, and the like are exposed on an overcoat formation surface (protected surface) of the substrate 100. The composite coating device 1 carries out one process in one chamber, so that it is possible to prevent mutual contamination between the processing chambers. Also, the substrate 100 is consecutively processed without being exposed to the atmosphere in the middle of the processing, so that it is possible to prevent oxidation of the substrate 100, sticking of a dust, and the like.

Figure 2:
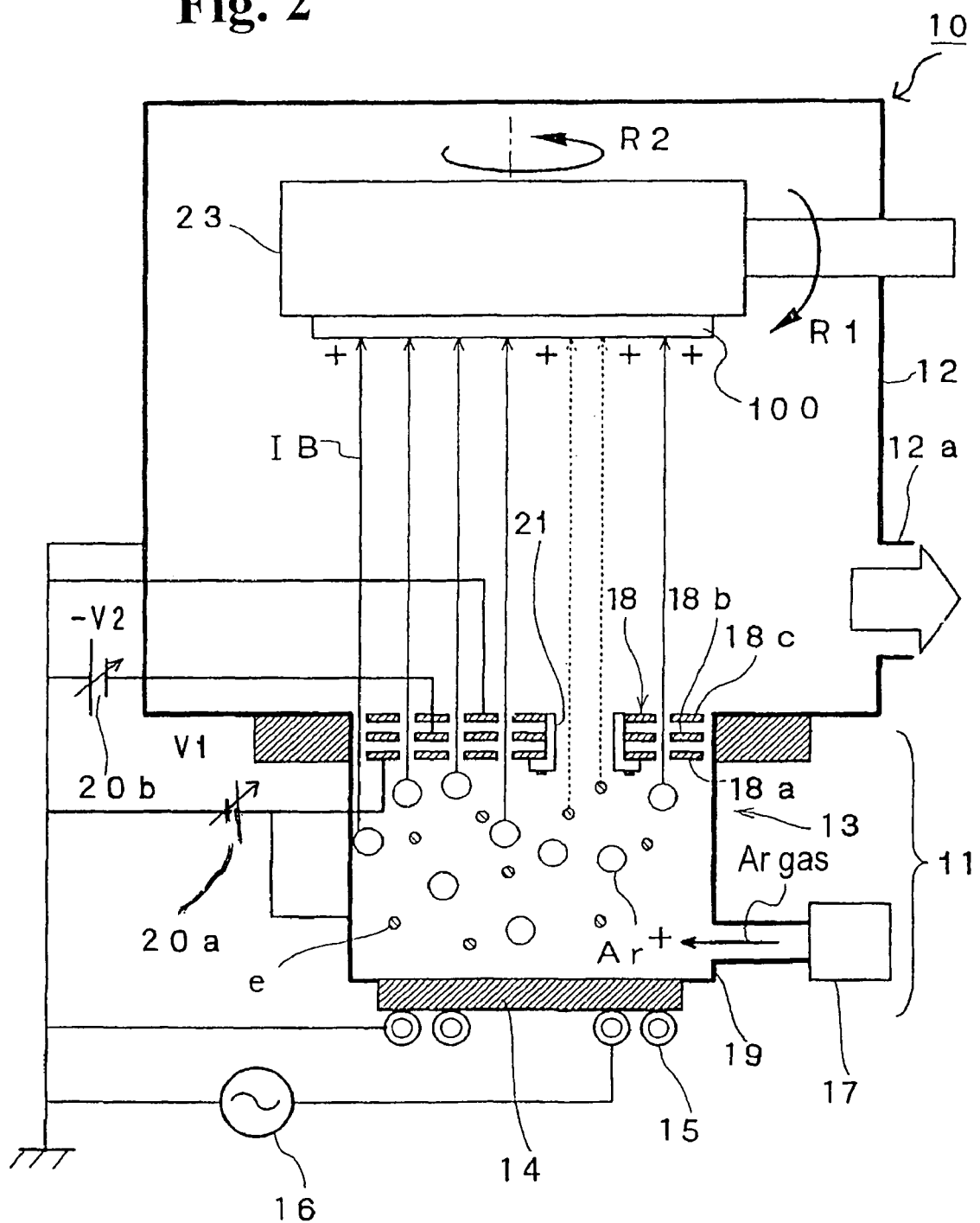
FIG. 2 is a schematic view showing a structure of an ion beam etching device according to the embodiment of the present invention.

The substrate 100 is transferred to the IBE device 10 from the conveyance chamber 3, and the etching process is carried out on the protected surface in the IBE device 10. In the etching process, the protected surface of the substrate 100 is removed as much as 20 nm in depth as the cleaning process before the amorphous silicon coat is formed. As shown in FIG. 2, the IBE device 10 is provided with an ion source 11 and a process camber 12 wherein the etching process is carried out. The ion source 11 is formed of electrodes 18 for leading out ions in a plasma source 13, i.e. plasma production means.

The plasma source 13 is a high-frequency induction coupled plasma source for generating plasma through high-frequency induction coupling. A high-frequency introductory window 14 is provided in a plasma chamber 19 of the plasma source 13, and flat-surface excitation coils 15 are provided outside the high-frequency introductory window 14 for generating high frequencies. A RF power source 16 is connected to the excitation coils 15 for supplying a high-frequency electric current of 13.56 MHz. A dielectric material such as quartz, ceramic, and the like is used for the high-frequency introductory window 14. A matching circuit (not shown) is provided between the excitation coil 15 and the RF power source 16 for matching impedance.

In the plasma chamber 19, gas for plasma production is introduced via a gas supply source 17. In the present embodiment, argon gas is used as an example. Grids 18a, 18b, and 18c constituting the electrodes 18 for leading out ions are provided at an opening of the plasma chamber 19. A positive potential V1 is supplied to the grids 18a via a grid power source 20a, and a negative potential (−V2) is supplied to the grids 18b via a grid power source 20b. The grids 18c have earth potential Vg, and the plasma chamber 19 has potential (V1) same as that of the grids 18a.

In the embodiment, an electron port 21 made of a conductive material is provided in the electrodes 18 for leading out ions. The electron port 21 (described below) is attached to the grids 18a, and has the same potential (V1) as that of the grids 18a. A substrate holder 23 is provided in the process chamber 12 for holding the substrate 100 as an etching object. The substrate holder 23 is arranged to be tiltable as shown by R1, and rotatable as shown by R2. A vacuum pump (not shown) is connected to an exhaust port 12a for evacuating the inside of the process chamber 12.

When argon gas is introduced into the plasma chamber 19 and high frequency generated at the excitation coil 15 is introduced into the plasma chamber 19 from the high-frequency introductory window 14, electrons are separated from argon atoms, and plasma including argon ions $Ar^+$ and electrons e are generated. The argon ions $Ar^+$ are accelerated with an electric field between each positive potential grid 18a and each negative potential grid 18b and then, decelerated between each grid 18b and each earth potential grid 18c. In the end, ion beams IB having energy corresponding to a potential difference between the grids 18a and the grids 18c are formed.

The accelerated argon ions Ar$^+$ irradiate on the substrate 100, and etch the surface of the substrate. When the substrate 100 is made of a conducting material, a positive charge of argon ions Ar$^+$ irradiating on the substrate 100 flows to the substrate holder 23 connected to the substrate 100. When the substrate 100 is made of an insulation material such as $SiO_2$, the positive charge is accumulated on the surface of the substrate and the potential of the substrate increases, as shown in FIG. 2. The electric field between the grids 18a and the grids 18b prevents electronegative electrons e from leaking in the process chamber 12.

As shown in FIG. 2, a tubular portion of the electron port 21 with the same potential as the grids 18a extends to the grids 18c. Accordingly, the grids 18b do not affect the inside of the tubular portion, thereby forming an approximately equal potential inside the tubular portion. As a result, there is no electric field preventing the electrons e from moving, so that the electrons e can easily move toward the process chamber 12. When the substrate 100 is positively charged, the electrons e can easily move toward the positive direction, so that the electrons e inside the plasma chamber 19 are led out of the electron port 21 toward the substrate 100 and irradiate on the substrate 100.

When the positive charge is not accumulated on the substrate 100, the electrons e are not led out through the electron port 21. Accordingly, the electrons e corresponding to an amount of the positive charge accumulated on the substrate 100 irradiate on the substrate 100 through the electron port 21 from the plasma chamber 19, so that the positive charge of the substrate 100 is neutralized.

As described above, the electron port 21 is provided in the electrodes 18, and the grids 18b do not prevent the electrons e from moving toward the process chamber. As a result, the electrons e inside the plasma move toward the electropositive substrate 100 to neutralize the positive charge of the substrate 100, so that the etching effect of the argon ion Ar$^+$ is maintained.

Also, the electrons e irradiate on the substrate 100 for the amount automatically determined by the charged amount of the substrate 100, so that it is not necessary to adjust the amount of the electrons without a problem of too small or too large amount. The electrons e move faster compared to the argon ions Ar$^+$, the electrons e neutralize quickly when the substrate 100 is charged in positive. Specifically, just the electron port 21 is provided in the electrodes 18, thereby reducing cost as compared to a conventional method wherein a heater for thermal emission or another plasma source is provided.

Next, etching characteristics of the substrate 100 with the IBE device will be explained. FIG. 8(a) is a partial cross sectional view showing a state that the substrate 100 is etched with the IBE device. FIG. 8(b) is a partial cross sectional view showing a state wherein an amorphous silicon coat 103 and a DLC coat 104 are formed on the substrate 100 after the etching. A line A1 indicates the surface (protected surface) formed of a base metal 101 and an electrode metal 102 before the etching. A line A2 indicates a surface after only a depth D is removed by the etching with the IBE device.

As shown in FIGS. 8(a) and 8(b), the base metal 101 and the electrode metal 102 have different etch rates, so that an actual A2 looks more like A3 shown in FIG. 8(c). For example, when $Al_2O_3$TiC is used for the base metal 101 and FeNi (Permalloy) is used for the electrode metal 102, the softer Permalloy is deeply etched, and a step d is formed as shown in FIG. 8(c). Therefore, the flight height increases by the step, so that it is difficult to obtain a high record density.

In addition, when the step d is formed, it is difficult to properly form the amorphous silicon coat 103 and the DLC coat 104. The amorphous silicon coat 103 and the DLC coat 104 have small thicknesses. Accordingly, even though the step d may be small, it is difficult to cover the step, thereby causing a micro-crack or residual stress, and lowering corrosion resistance.

Figure 10:
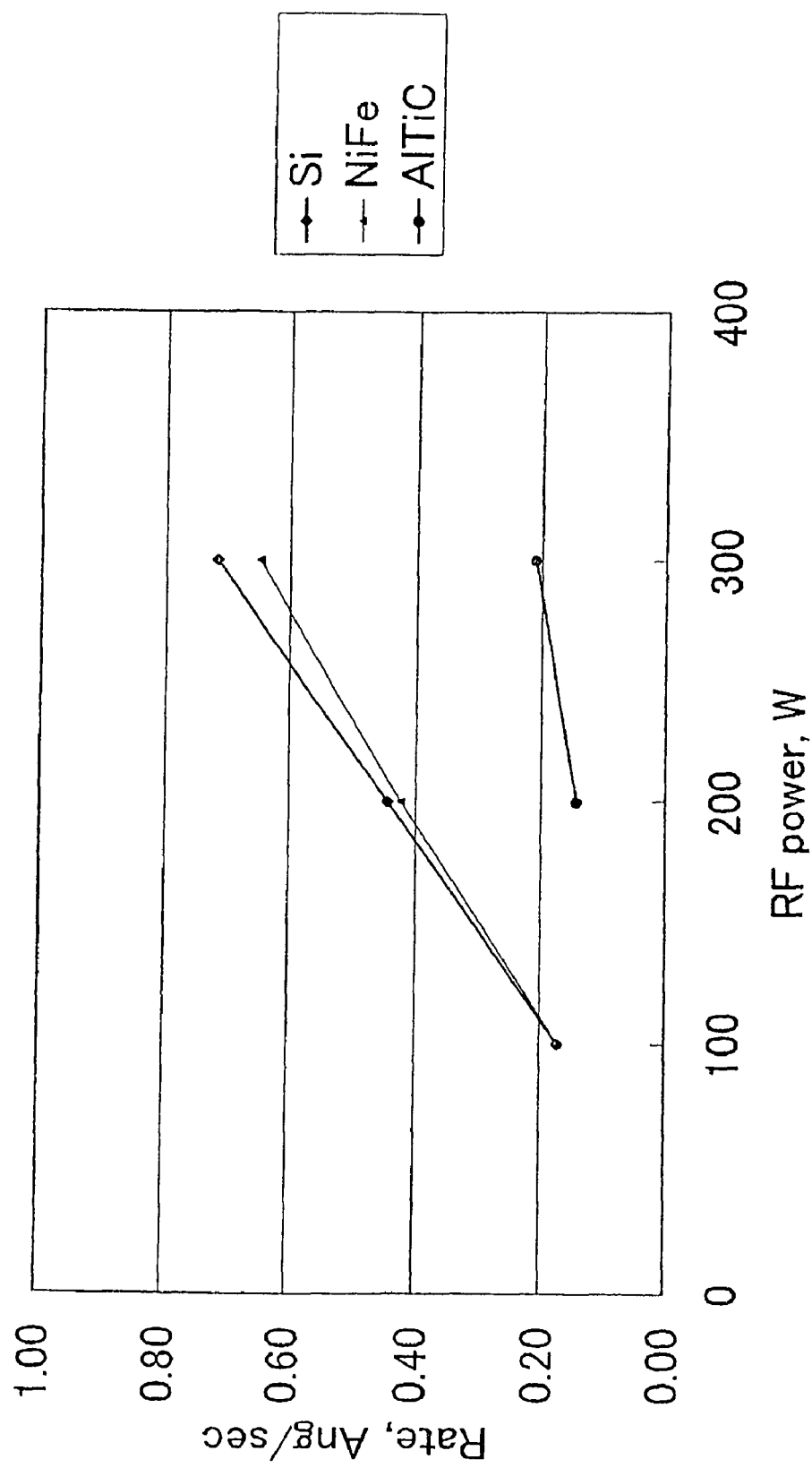
FIG. 10 is a graph showing etching performance of a conventional sputter etching device.

As shown in FIG. 10, in conventional sputter etching (SE), an etch rate of FeNi is higher than that of $Al_2O_3$TiC. When RF electric power is 200 W, the etch rate of FeNi is three times higher than that of $Al_2O_3$TiC, and when the RF electric power is 300 W, the etch rate of FeNi is 3.2 times higher than that of $Al_2O_3$TiC. On the other hand, as shown in FIG. 9, in the IBE of the present embodiment, etch rates of the FeNi and $Al_2O_3$TiC are function of an inclined angle of the substrate 100 relative to the ion beam, and when the inclined angle is 75°, the difference becomes a minimum. The substrate holder 23 tilts as shown by R1 to change the inclined angle. Since the ion beam has directivity, the etch rate of a different material can be adjusted by the inclined angle. As a result, the step d shown in FIG. 8(c) becomes very small, so that the magnetic head coated with the amorphous silicon coat 103 and the DLC coat 104 reduces the flight height. Also, since the step d is very small, it is easy to form the amorphous silicon coat 103 and the DLC coat 104, so that the corrosion resistance of the overcoat is improved.

Figure 3:
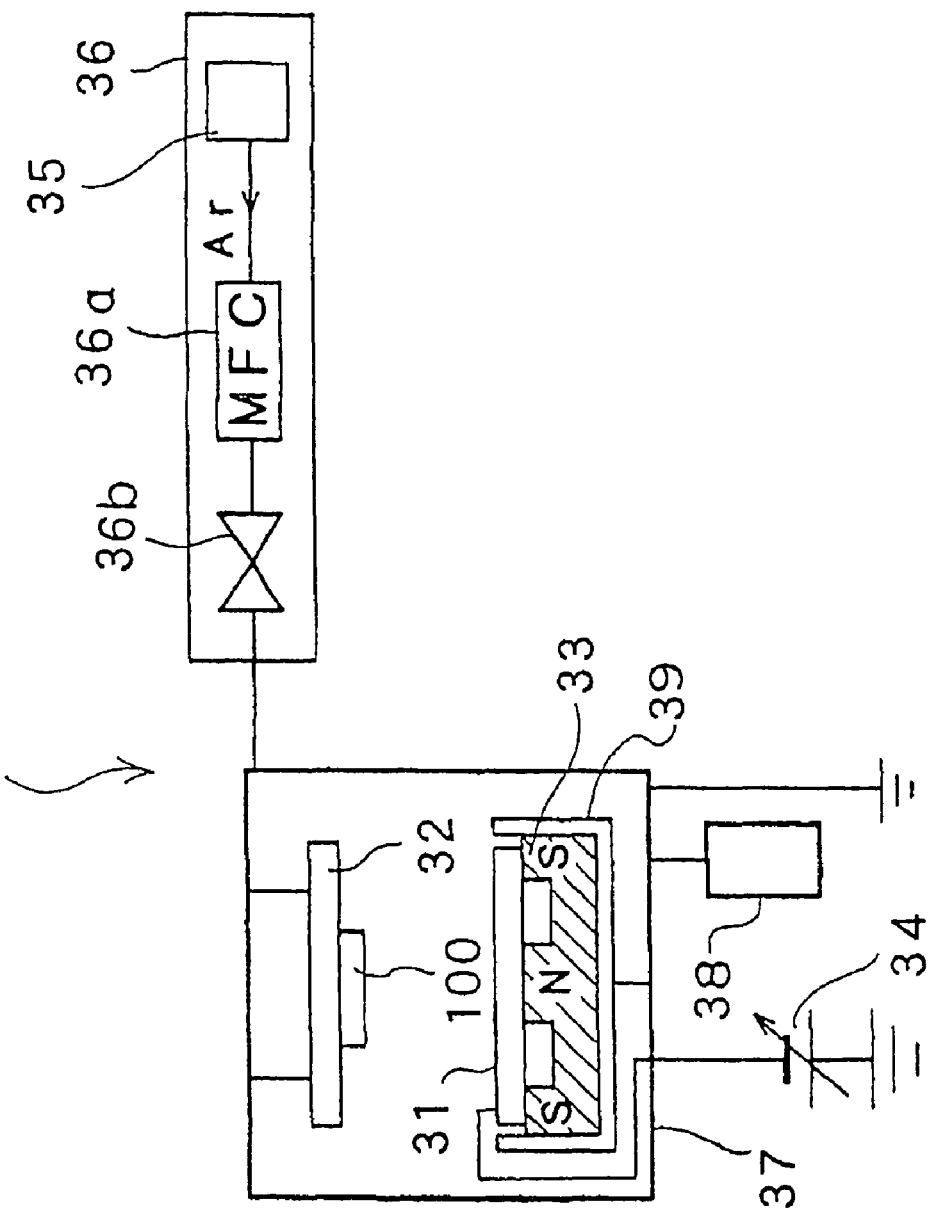
FIG. 3 is a schematic view showing a structure of a magnetron sputter deposition device.

After the etching process, the substrate 100 is conveyed to the conveyance chamber 3 and then to the MSD device 30 through the gate 5. FIG. 3 is a view showing the DC type MSD device for forming the amorphous silicon coat, and the amorphous silicon coat is formed with a thickness of 0.5 nm. A silicone (Si) target 31 is placed on a target holder 39 provided in a sputter chamber 37 of the MSD device 30. The target holder 39 is a cathode, and the substrate 100 is attached to an anode 32. The substrate 100 is held in such a way that the coated surface faces down. A magnet 33 is provided in the target holder 39, and a negative bias voltage is applied the Si target 31 from a bias power source 34. The magnet 33 is provided for generating a parallel magnetic field around a surface of the Si target 31. Argon gas (Ar) is supplied as process gas to the sputter chamber 37. The argon gas is supplied from a supply source 35 through a mass-flow controller 36a and a valve 36b of a gas feeding device 36.

In the coating process, the argon gas is supplied to the sputter chamber 37, and a vacuum device 38 evacuates the inside of the sputter chamber 37, so that the inside of the sputter chamber 37 has a predetermined process pressure and plasma is generated. The Si target 31 is sputtered by the argon ion in the plasma, and sputtered Si particles are accumulated on the coated surface of the substrate 100 and form the amorphous silicon coat.

Figure 4:
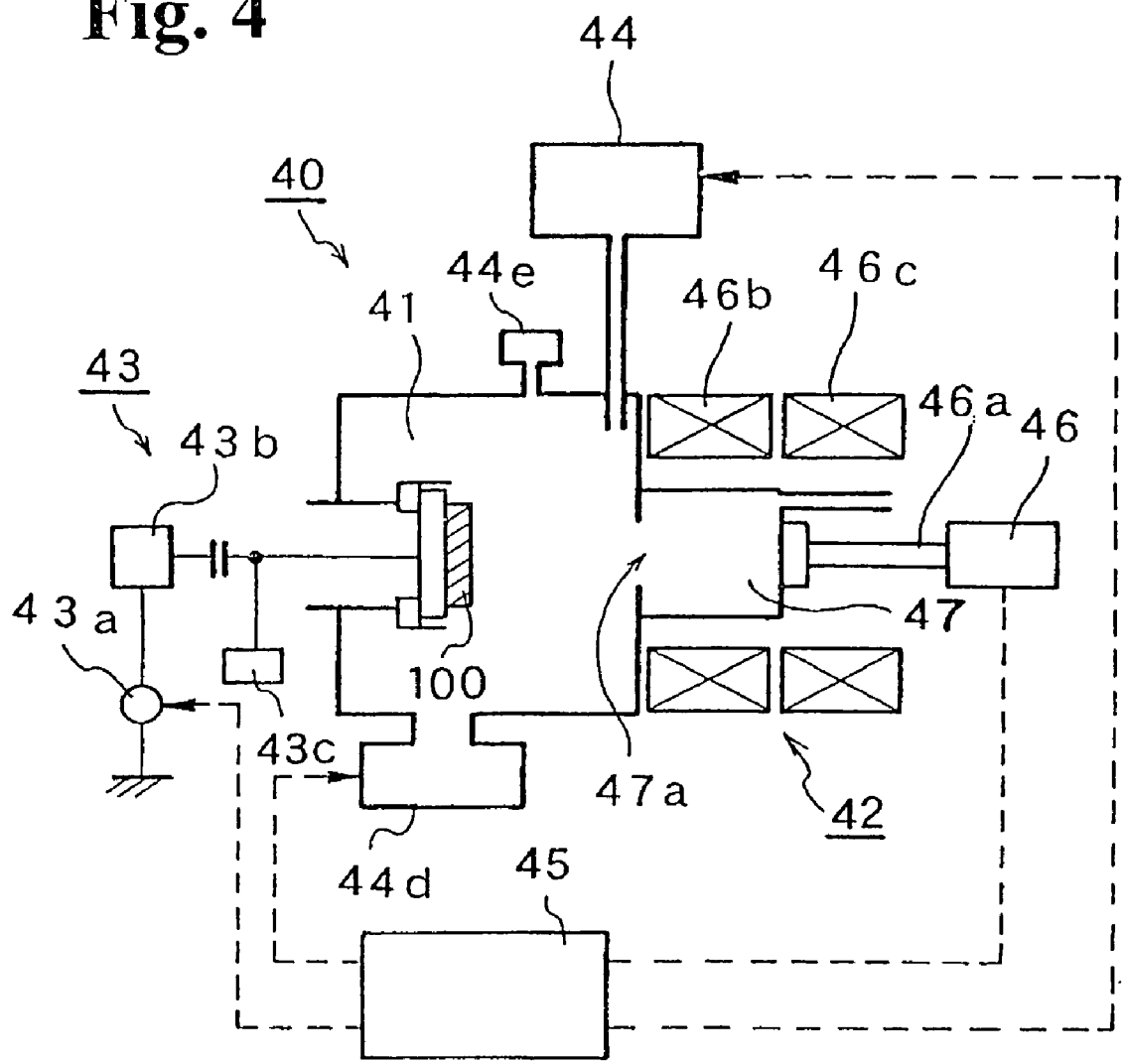
FIG. 4 is a schematic view showing a structure of an electron cyclotron resonance plasma chemical vapor epitaxy device.

After the coating process of the amorphous silicon coat, the substrate 100 is conveyed to the conveyance chamber 3 through the gate 6, and then to the ECR-CVD device 40 through the gate 7. FIG. 4 is a view of the ECR-CVD device for forming the DLC (diamond-like carbon) coat, and the DLC coat is formed with a thickness of 1 nm. The ECR-CVD device 40 comprises a reaction chamber 41 for forming a thin coat on the substrate 100 with the amorphous silicon coat formed thereon; an ECR plasma generation portion 42 for introducing plasma into the reaction chamber 41; a bias power source portion 43 for applying a bias voltage to the substrate 100; and a control portion 45 for controlling the whole device, coating conditions, and a reaction gas introductory portion 44 to introduce reactive gas into the reaction chamber 41.

The ECR plasma generation portion 42 is a mechanism for supplying microwave electric power to the magnetic field to generate the electron cyclotron resonance plasma, and for introducing the plasma flow into the reaction chamber 41. A microwave source 46 generates a microwave of 2.45 GHz, and the microwave is introduced into a plasma chamber 47 through a wave guide 46a to discharge the microwave. In addition, a magnetic flux density 875 G at the ECR condition is formed with the magnetic filed generated by coils 46b and 46c to generate electron cyclotron resonance, so that activated ECR plasma is generated. The ECR plasma generated inside the plasma chamber 47 moves toward the substrate 100 inside the reaction chamber 41 along the divergent magnetic field from the plasma window 47a.

In the bias power source portion 43, a bias power source 43a is connected to a substrate holding mechanism inside the reaction chamber 41 through a matching unit 43b, and a negative bias voltage is applied to the substrate 100 disposed inside the reaction chamber 41. A voltage monitor 43c measures the bias voltage. The reactive gas introduced into the reaction chamber 41 from the reaction gas introductory portion 44 is ionized inside the high density plasma generated by the ECR, and the DLC coat is formed on the substrate 100 with the negative bias voltage. When the DLC coat is formed, ethylene ($C_2H_4$), methane ($CH_4$), propane ($C_3H_8$), or the like is provided through the reaction gas introductory portion 44 as coating gas. An exhaust pump 44d exhausts the reaction chamber 20, and a pressure gauge 44e measures the pressure inside the reaction chamber 20.

Figure 5:
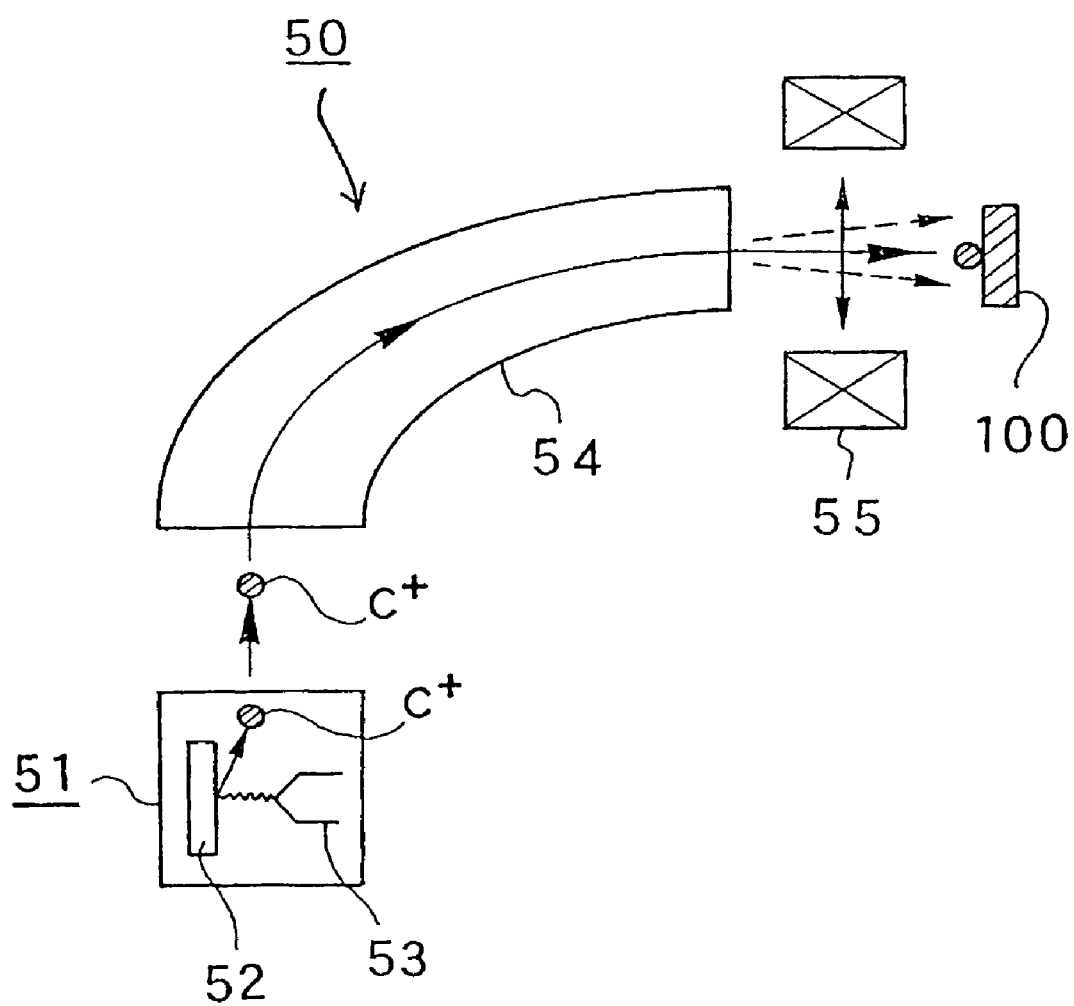
FIG. 5 is a schematic view showing a structure of a cathode arc discharge deposition device.

Instead of the ECR-CVD device forming the DLC coat, a cathode arc discharge deposition device may form a ta-C (tetrahedral amorphous carbon) coat. FIG. 5 is a view of an FCVA (Filtered Cathode Vacuum Arc) device as the cathode arc discharge deposition device. A carbon ion generation source 51 generates a carbon ion $C^+$ via vacuum arc discharge between a cathode 52 and an anode 53. The cathode 52 is formed in a disk shape made of high-purity graphite. The carbon ions $C^+$ generated at the carbon ion generation source 51 are coated on the substrate 100 after passing through a filter 54. The filter 54 allows only required carbon ions to pass through using the electric field and the magnetic filed, and the filter 54 removes large carbon particles or neutral carbon atoms.

Magnetic coils 55 are provided near an exit of the filter 54 for scanning carbon ion beams, so that the ta-C coat is uniformly formed on the substrate 100. A bias voltage is applied to the substrate 100, and energy of the ions arriving at the substrate 100 depends on the bias voltage, so that the coating characteristics can be adjusted through the bias voltage.

Figure 6:
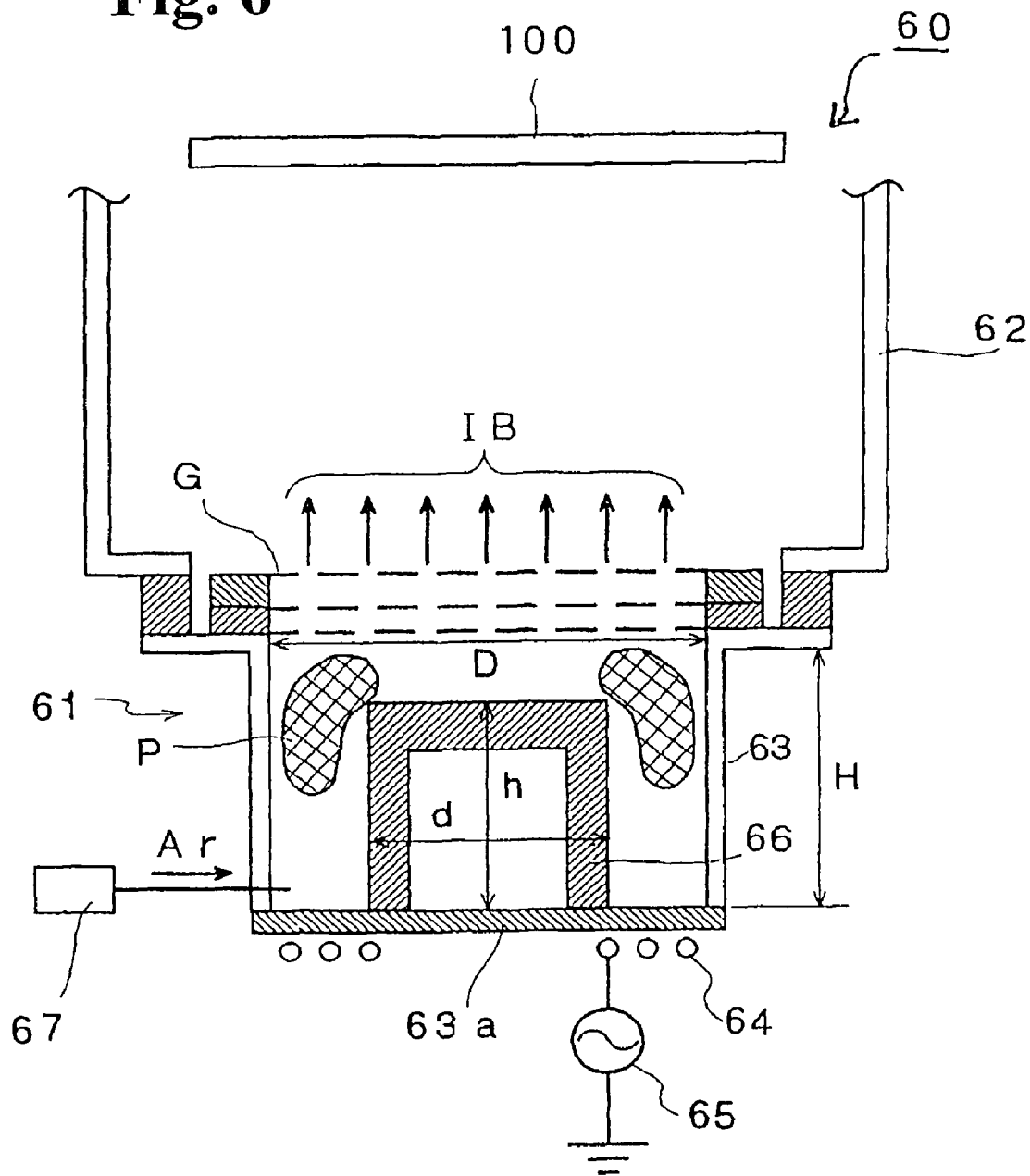
FIG. 6 is a schematic view showing a first modified example of the ion beam etching device according to the embodiment of the present invention.

FIG. 6 is a view showing a modified example of the IBE device. The IBE device 60 is composed of a plasma production portion 61 and a vacuum chamber 62. The substrate 100, i.e. the etching object, is placed in the vacuum chamber 62. The plasma production portion 61 is disposed at a position facing the substrate 100 inside the vacuum chamber 62. The plasma production portion 61 comprises a plasma chamber 63 including a cylindrical plasma formation space; antenna coils 64; and a high-frequency power 65. The plasma production portion 61 generates plasma with an inductive coupled plasma excitation method.

A dielectric window 63a formed of ceramic and the like is provided at a bottom surface of the plasma chamber 63. The antenna coils 64 are provided at outside the dielectric window 63a. The antenna coils 64 form a high-frequency magnetic field inside the plasma chamber 63 through the dielectric window 63a. A cylindrical dielectric block 66 is provided inside the plasma chamber 63 for adjusting a plasma distribution. When plasma production gas (for example, argon gas) is supplied into the plasma chamber 63 through a gas supply device 67 and the antenna coils 64 form the high-frequency magnetic field, plasma P is generated inside the plasma chamber 63. A porous electrode grid G for leading out ions is provided at an opening of the plasma chamber 63. Charged particles such as ions are led out of the plasma chamber 63 via the grid G, and ion-beams IB are accelerated.

In the plasma production portion 61, the cylindrical dielectric block 66 is disposed coaxially with the antenna coils 64. At this moment, the plasma P does not enter an area of the dielectric block including the internal space of the dielectric block 66. As a result, the plasma P is distributed around the dielectric block 66 in a doughnut shape. A density distribution of the plasma P is related to a distribution of an ion current value, i.e. a density distribution of the ion-beams IB. When the density distribution of the plasma has a doughnut shape around the coil shown in FIG. 6, the ion current value of the ion-beams IB led out of the plasma P has a two-top distribution wherein the center of the coil is a concave portion. It is possible to adjust the distribution of the current value by moving the dielectric block 66 inside the plasma P. In the etching process, the surface of the substrate 100 is removed as much as 20 nm in depth, and the cleaning is completed before the amorphous silicon coat is formed.

Figure 7:
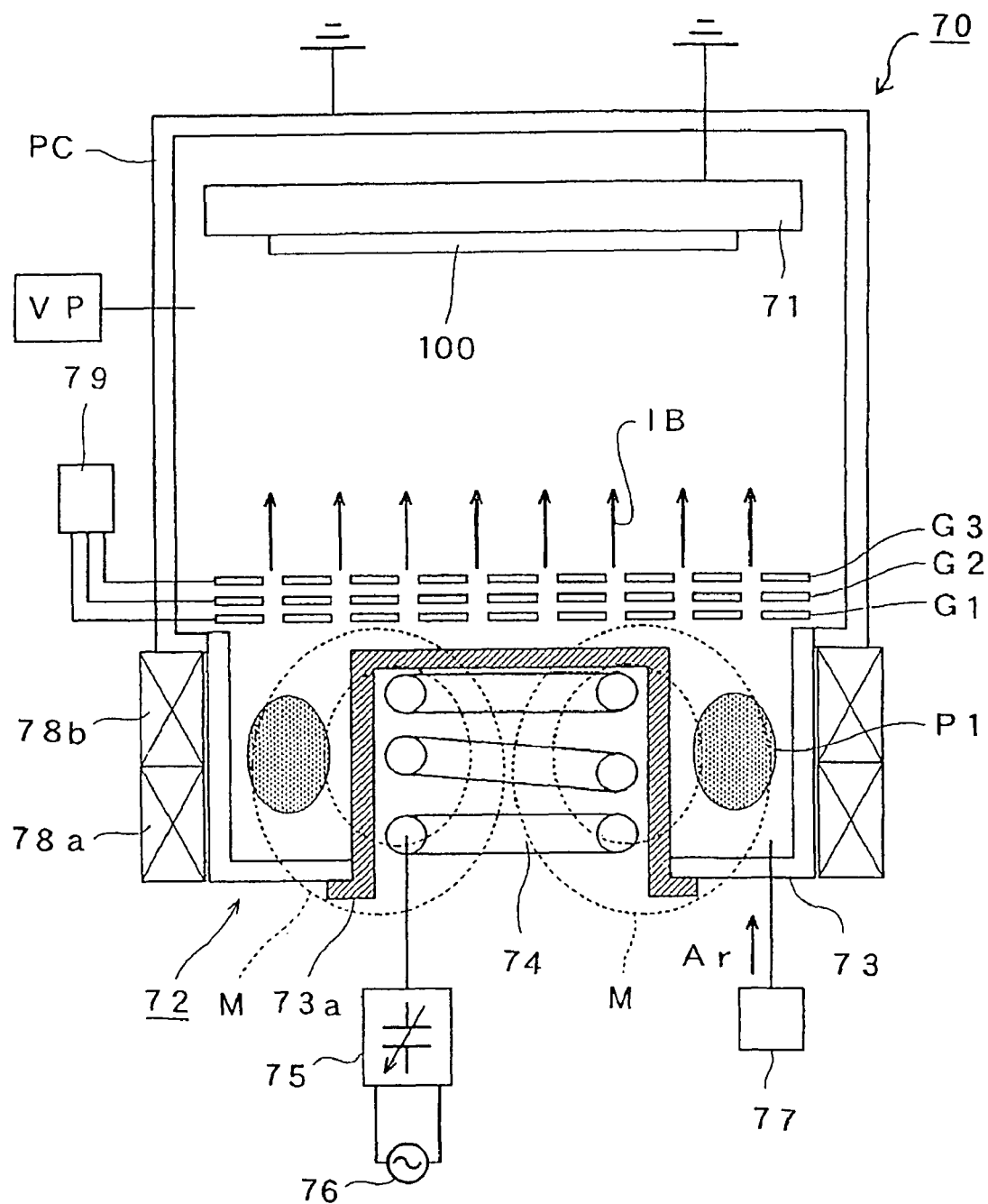
FIG. 7 is a schematic view showing a second modified example of the ion beam etching device according to the embodiment of the present invention.

FIG. 7 is a view showing another modified example of the IBE device. In an IBE device 70, a stage 71 is provided inside a process chamber PC for placing the substrate 100. A high-frequency induction coupled plasma source 72 is provided at a position facing the stage 71 in the process chamber PC. When the inside of the process chamber PC is evacuated via a vacuum pump VP during the etching process, the inside of a plasma production chamber 73 of the high-frequency induction coupled plasma source 72 is also evacuated in a decompressed state.

A protrusion 73a projecting into the plasma production chamber 73 is provided at a midsection of the plasma production chamber 73. An excitation coil 74 is disposed in a concave portion formed outside the protrusion 73a for forming an alternate current magnetic field M inside the plasma production chamber 73. The protrusion 73a is formed of an insulator such as glass, ceramic, and the like, and functions as a high-frequency introductory window for introducing the alternate current magnetic field formed by the excitation coil 74 into the plasma production chamber 73. The excitation coil 74 is a solenoid-type coil, and connected to a RF power source 76 through a matching device 75. Incidentally, in the present embodiment, the excitation coil 74 is the solenoid-type coil, and may be a flat-type coil with one tern.

The RF power source 76 uses a frequency from 1 to 100 MHz for an economical reason, and the high-frequency power of 13.56 MHz is used in the present embodiment. A capacitor for matching impedance is provided in the matching device 75. By adjusting a capacitance of the capacitor, a matching condition can be adjusted. When plasma is generated, argon gas or the like is introduced into the plasma production chamber 73 from a gas supply source 77.

Ring-shaped magnets 78a and 78b are provided on an outer periphery of the plasma production chamber 73 for forming a static magnetic field in the plasma production chamber 73. The magnets 78a and 78b are formed of an electromagnet, and may be formed of a permanent magnet. The magnets 78a and 78b form a cusped magnetic field. When the high-frequency voltage is applied to the excitation coil 74, argon gas is excited via inductive coupling, and plasma P1 including the argon ions is generated in a ring-shaped space between the plasma production chamber 73 and the protrusion 73a. Electrons in the plasma P1 are trapped by the cusped magnetic field, thereby facilitating the plasma production and efficiently forming the plasma P1.

Grids G1, G2, and G3 are provided at an opening of the plasma production chamber 73 for leading out the argon ions from the generated plasma P1. A grid power source 79 applies a grid voltage to the grids G1 to G3. For example, a voltage of 800 V is applied to the grid G1 and a voltage of 400 V is applied to the grid G2, respectively. The grid G3 is grounded and has a potential of 0 V. When the voltages are applied to the grids G1 to G3, the ion beams IB of the argon ions are led out of the plasma source 72 upwardly, and irradiate on the substrate 100.

In the plasma source 72 shown in FIG. 7, the protrusion 73a formed of an insulator projects into the plasma production chamber 73, so that the plasma P1 does not enter an area of the protrusion 73a. As a result, the plasma P1 is distributed between the protrusion 73a and the plasma production chamber 73 in a ring shape around the protrusion 73a. In the etching process, the surface of the substrate 100 is removed as much as 20 nm in depth, and the cleaning process is completed before the amorphous silicon coat is formed.

Figure 11:
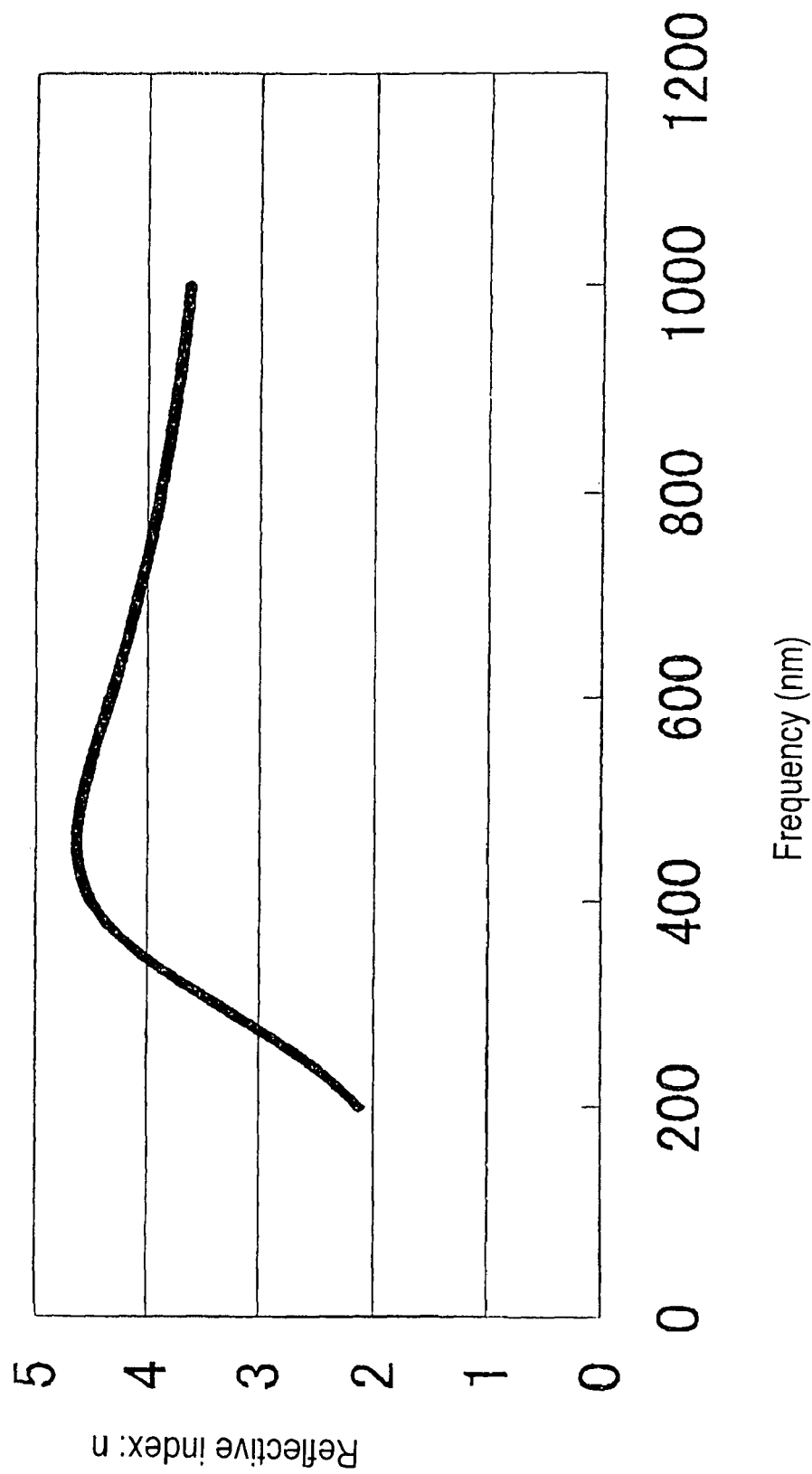
FIG. 11 is a graph showing an optical characteristic of reflective index of an amorphous silicon coat formed with a magnetron sputter deposition device according to the embodiment of the present invention.
Figure 12:
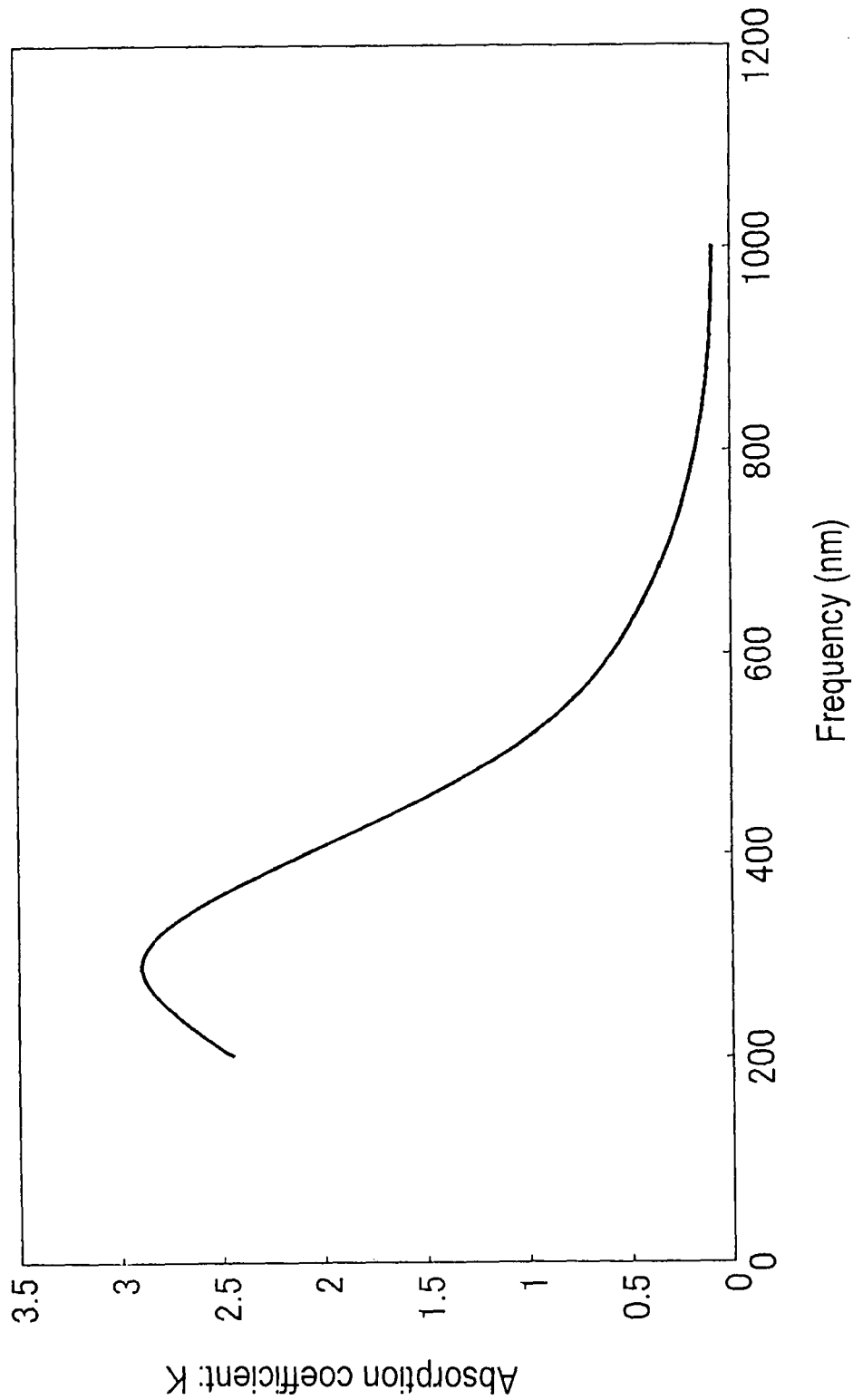
FIG. 12 is a graph showing an optical characteristic of absorption coefficient of the amorphous silicon coat formed with a magnetron sputter deposition device according to the embodiment of the present invention.

Finally, the amorphous silicon coat and the carbon coat formed with the composite coating device 1 of the present embodiment will be explained. FIG. 11 is a graph showing spectral characteristics of the amorphous silicon coat formed with the MSD device 30, wherein the vertical axis represents a refractive index n and the horizontal axis represents a wavelength. FIG. 12 is a graph showing spectral characteristics of the amorphous silicon coat formed with the MSD device 30, wherein the vertical axis represents an absorption coefficient k and the horizontal axis represents a wavelength. The refractive index n and the absorption coefficient k are indicators of a nature of the amorphous silicon coat.

Figure 13A:
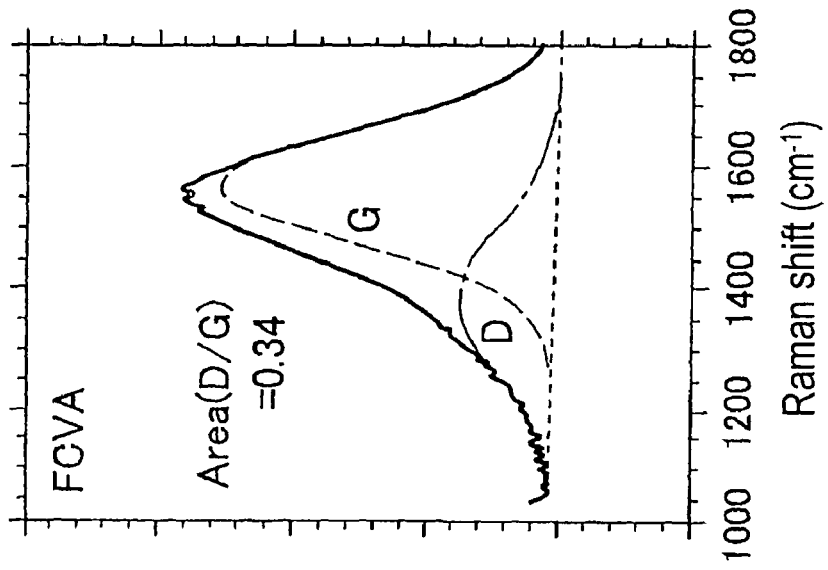
FIGS. 13(a) and 13(b) are graphs showing Raman spectrum of carbon layers formed with an ECR-CVD device and a FCVA device according to the embodiment of the present invention.
Figure 13B:
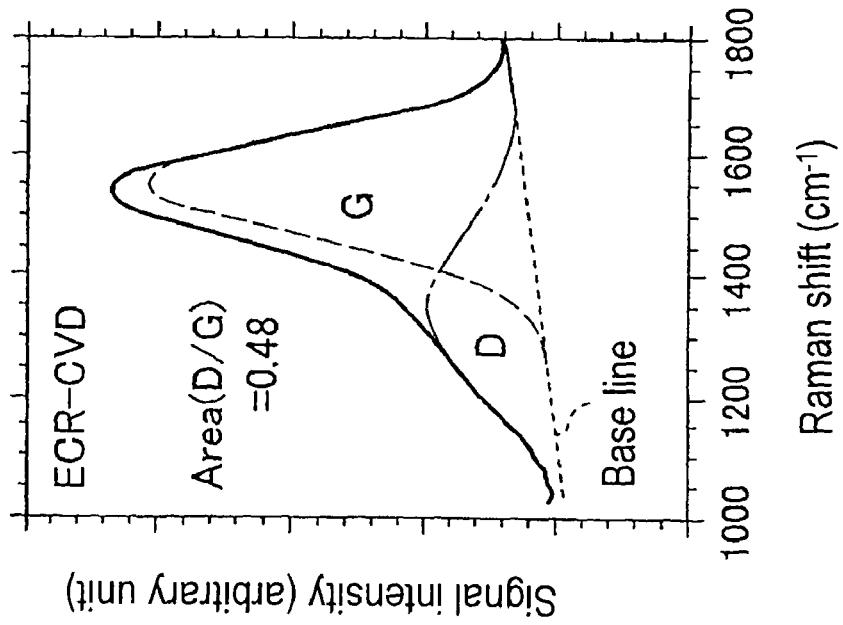

FIGS. 13(a) and 13(b) are graphs showing Raman spectra of the carbon layers formed with the ECR-CVD device and the FCVA device, wherein the vertical axis represents a signal strength and the horizontal axis represents a wavelength. FIG. 13(a) shows the carbon layer formed with the ECR-CVD device and FIG. 13(b) shows the carbon layer formed with the FCVA device. The spectra were analyzed with a peak resolution analysis to identify a component associated with a diamond structure (D) and a component associated with a graphite structure (G), and an area ratio of the peak areas, i.e. Area (D/G), was determined. The carbon layer formed with the ECR-CVD device has the Area (D/G) of 0.48, and the carbon layer formed with the FCVA device has the Area (D/G) of 0.34. The Area (D/G) is an indicator of a nature of the carbon layer.

As explained above, according to the present invention, the substrate is tilted by a predetermined angle using the IBE, so that the step between the base metals and the electrode metal can be reduced. Accordingly, it is possible to form the overcoat on the magnetic head with a small flight height.

While the invention has been explained with reference to the specific embodiments of the invention, the explanation is illustrative and the invention is limited only by the appended claims.

What is claimed is:

1. A composite coating device for forming a coating on a magnetic head, comprising:
    a first processing chamber for performing an ion beam etching process in which an ion beam is irradiated on a surface of the magnetic head at a predetermined angle to clean the surface,
    a second processing chamber for performing a magnetron sputter deposition in which a shock absorbing coating is formed on the surface,
    a third processing chamber for performing one of an electron cyclotron resonance plasma chemical vapor epitaxy and a cathode arc discharge deposition in which a protection coating is formed on the shock absorbing coating,
    a preparation chamber communicating with the first to third processing chambers through opening and closing means for transferring the magnetic head, and
    an ion beam etching device attached to the first processing chamber and including an ion source for generating ions, a plasma generating area, an electrode disposed between the first processing chamber and the plasma generating area for leading ions to the first processing chamber and having a first grid with a positive potential and a second grid with a negative potential, and a communicating port having a potential same as that of the first grid and passing through the first and second grids for communicating the plasma generating area and the first processing chamber, said communicating port allowing electrons in the plasma generating area to pass freely to the first processing chamber therethrough.

2. A composite coating device according to claim 1, wherein said ion beam etching device further includes a dielectric block situated in the plasma generating area for adjusting a density distribution of plasma.

3. A composite coating device according to claim 1, wherein said ion beam etching device further includes an electric insulation dividing wall protruding into the plasma generating chamber for separating the plasma generating chamber from outside, and an excitation coil disposed in a concave portion of the electric insulation dividing wall.

4. A composite coating device according to claim 1, further comprising a substrate holder disposed in the first processing chamber for rotatably holding the magnetic head so that the ion beam is irradiated on the surface of the magnetic head at the predetermined angle.

5. A composite coating device according to claim 1, wherein said shock absorbing coating is formed of a silicon layer, and said protection coating is formed of a carbon layer.

6. A composite coating device according to claim 5, wherein said silicon coat is formed of an amorphous silicon, and said carbon layer is formed of diamond-like carbon or tetrahedral amorphous carbon.

7. A method of forming a coating on a magnetic head, comprising an ion beam etching, magnetron sputter deposition, and one of electron cyclotron resonance plasma chemical vapor epitaxy and cathode arc discharge deposition using the composite coating device according to claim 1.

8. A magnetic head formed by the method according to claim 7.

9. A composite coating device according to claim 1, wherein said communicating port is made of a conductive material and attached to the grid.

10. A composite coating device according to claim 9, wherein said electrode further includes a third grid having an earth potential disposed over the second grid at a side opposite to the first grid, said communicating port extending from the first to third grids.

* * * * *